United States Patent [19]
Hoffman

[11] 4,420,821
[45] Dec. 13, 1983

[54] STATIC RAM WITH NON-VOLATILE BACK-UP STORAGE AND METHOD OF OPERATION THEREOF

[75] Inventor: Charles R. Hoffman, Raleigh, N.C.

[73] Assignee: International Business Machines Corporation, Armonk, N.Y.

[21] Appl. No.: 350,480

[22] Filed: Feb. 19, 1982

[51] Int. Cl.[3] .............................................. G11C 11/40
[52] U.S. Cl. .................................... 365/154; 357/23; 365/185
[58] Field of Search .............................. 365/185, 154; 357/23 VT

[56] References Cited

U.S. PATENT DOCUMENTS 3,676,717 7/1972 Lockwood .
4,207,615 6/1980 Mar ..................................... 365/185
4,388,704 6/1983 Bertin et al. ......................... 365/185

OTHER PUBLICATIONS

Electronics, Oct. 11, '79, R. Klein et al., "5-Volt-Only, Nonvolatile RAM owes it all to Polysilicon".
ISSCC, Feb. 18, '81, WAM 3.2: A Dual-Gate Floating-Gate FET Device, H. Kotecha et al.
ISSCC 81, Feb. 19, '81, THPM 12.1: A Single 5V Supply Nonvolatile Static RAM, J. Drori et al.
IEEE Trans. on Electron Devices, vol. ED-28, No. 9, Sep. '81, D. DiMaria et al., "Dual Electron Injector Structure Electrically . . . ".
IBM Technical Disclosure Bulletin-vol. 24, No. 73, Dec. 1981, pp. 3691-3692.

Primary Examiner—James W. Moffitt
Attorney, Agent, or Firm—Edward H. Duffield

[57] ABSTRACT

An FET semiconductor memory array composed of cells each including a flip-flop static memory element and a non-volatile memory element including a dual gate FET. One of the gates of the FET is a floating gate which is separated from the channel of the dual gate FET by the same thin oxide layer that separates the other of the gates from the channel of the dual gate FET. A segment of DEIS (Dual Electron Injection Stack) is disposed between the floating gate and an upper control electrode. A data node of the flip-flop circuit is connected to a node of the non-volatile element through another FET. A capacitor is connected between the floating gate and the latter node.

12 Claims, 6 Drawing Figures

STATIC RAM WITH NON-VOLATILE BACK-UP STORAGE AND METHOD OF OPERATION THEREOF

BACKGROUND OF THE INVENTION

The invention pertains to an MOS memory device. More specifically, the invention pertains to a static-type MOS RAM (Random Access Memory) which has a non-volatile back-up storage capability.

A great deal of research activity has recently been conducted to develop a non-volatile random access memory on a single silicon chip. Prior to the availability of non-volatile random access memories fabricated on a single silicon chip, the most common way of achieving non-volatility was to provide a battery back-up for the MOS memory. When a main power supply failed, the battery was automatically switched in to power the device until the main power source could be brought back on-line. This arrangement was generally not satisfactory because the battery was expensive, the battery required periodic maintenance and replacement and, if the battery failed, the data stored in the memory was disastrously lost. For these reasons, it is desirable to provide a non-volatile random access memory which does not require a battery back-up.

A non-volatile memory device fabricated on a single silicon chip is disclosed in "Dual-Electron Injector-Structure Electrically Alterable Read-Only Memory Model Studies", DiMaria et al., *IEEE Transactions on Electron Devices*, Vol. ED-28, No. 9, September 1981, and in co-pending patent application Ser. No. 124,003, filed Feb. 26, 1980, which is assigned in common with the present application. This memory device uses a cell structure composed of an n-channel MOS transistor with DEIS (Dual Electron Injector Stack) material positioned between a control gate and a "floating" polycrystalline silicon gate. Writing is performed by applying a negative voltage to the control gate. This negative voltage causes the injection of electrons from the top silicon-rich $SiO_2$ injector layer of the DEIS material to the floating polysilicon layer. Similarly, erasing is performed by applying a positive voltage to the control gate, which then injects electrons from a bottom silicon-rich $SiO_2$ injector layer of the DEIS material to the floating polysilicon layer.

The DEIS material is formed by a layer of insulating $SiO_2$ sandwiched between two silicon-rich $SiO_2$ injector layers. Polysilicon layers are located immediately outside the silicon-rich $SiO_2$ injector layers, the lower one of which forms the floating gate electrode and the upper one of which is connected to a gate line.

While this memory device does in fact provide non-volatile storage capability and is quite useful in a number of applications, it is still not acceptable for many applications in which random access memories have customarily been employed. The reasons for this are that the relatively long reading and writing times are required to get data in and out of the memory cells. Moreover, there is a serious drawback in that only a limited number (for instance, 10,000) reading and writing operations can be performed in a cell of this type.

To achieve higher normal operating speeds while retaining a non-volatile memory capability, several proposals have been made to pair non-volatile back-up storage cells with faster storage cells which do not have the non-volatile storage capability. During normal continuous operations, the memory operates using the volatile cells. If the power supply fails, back-up power is supplied for a relatively short period of time from a storage source such as a capacitor bank. As soon as the main power supply fails, data from the volatile cells is transferred to their paired non-volatile cells using the power from the back-up power source. When the normal power source is back on-line, a data transfer operation is made from the non-volatile cells back to the volatile cells, and then normal memory operation is continued. Examples of memories of this type using a static RAM configuration are described in "Five-Volt-Only, Non-Volatile RAM Owes It All To Polysilicon", *Electronics*, Oct. 11, 1979, pp. 111–116; "Completely Electrically Erasable Memory Behaves Like A Fast, Non-Volatile RAM", *Electronics*, May 10, 1979, p. 128; Drori et al., "A Single 5 V Supply Nonvolatile Static RAM", 1981 *IEEE International Solid State Circuits Conf. Proc.*, Feb. 19, 1981 pp. 148, 149; Kotecha et al., "A Dual-Gate Floating-Gate FET Device", 1981 *IEEE International Solid State Circuits Conf. Proc.*, Feb. 18, 1981 pp. 38, 39; U.S. Pat. No. 3,676,717, issued July 11, 1972 to Lockwood; and co-pending U.S. Pat. applications Ser. Nos. 192,579 now U.S. Pat. No. 4,388,704 and 192,580 now U.S. Pat. No. 4,399,522, filed Sept. 30, 1980 and assigned in common herewith.

Although the devices of these proposals do in some cases provide an increased minimum operating speed together with non-volatile storage for use during times of power failure, the density of the memory cells is not attractive on a cost/performance basis compared to a battery powered volatile random access memory arrangement.

The undesirably large cell required, for instance, in the memory described in "Five Volt Only Non-Volatile RAM Owes It All To Polysilicon", supra. is due to the relatively large breakdown voltages at the diffusion-to-substrate junction of the device which must be accommodated. Specifically, the maximum allowable voltage that can be applied to an N+ diffusion is determined by the breakdown voltage $BV_{N-P}$ of an N+P junction, which may be written as:

$$BV_{N-P}=MV_G+BV_{GO}$$

where $V_G$ is the gate voltage of the device, M is a constant close to unity and $BV_{GO}$ is the zero gate breakdown voltage.

When a device is scaled down to achieve a desired cell size, the doping levels of the various diffusions and the junction depths are scaled. This results in a reduction of the term $BV_{GO}$, and hence a decrease in the breakdown voltage.

Another drawback of prior art approaches, for instance, that of the Lockwood patent, is that, when a restore operation is performed when power is applied to the device to transfer data from non-volatile to volatile storage, the data in the non-volatile storage elements is lost. Hence, such memories have no latent image capability; that is, they cannot retain data in the non-volatile storage elements following a restore operation.

Another reason that prior art approaches have failed to achieve a desirably small cell size relates to the way in which the various capacitances within a memory cell are fabricated. For example, in the memory cell of the above-mentioned article "A Floating Gate FET Device", a relatively thick oxide layer lying between two levels of polysilicon conductors is used to form the dielectric material of the cell capacitors. Because of this, the size of the capacitors is larger than is desirable.

Thus, it is a primary object of the present invention to provide a high speed RAM device having a non-volatile back-up storage capability.

Further, it is an object of the present invention to provide such a memory device in which, in addition to the non-volatile storage capability, a latent storage capability is also provided.

It is yet a further object of the present invention to provide such a memory device having a very small cell size and simple construction.

It is also an object of the present invention to provide a method of operating such a memory device.

SUMMARY OF THE INVENTION

In accordance with these and other objects of the invention, there is provided a memory array composed of a number of memory cells, each cell including a volatile static element and a non-volatile element. The static element is composed of a two transistor FET flip-flop. The flip-flop is formed asymmetrically so that it will always be in a predetermined state immediately following application of power thereto. A data node is formed at the source of the FET which is in the logic 1 state after application of power.

The non-volatile memory element is connected to the data node. The non-volatile memory element is composed of a dual gate FET having a floating gate element and a separate control gate element. The potential of the floating gate element is controlled by current flowing through a DEIS insulator layer of the type described in the above-mentioned DiMaria et al. article. The floating gate is insulated from the channel of the second FET by a gate oxide layer with the DEIS material disposed above the floating gate. The second control gate, which is insulated from the channel by the gate oxide layer, is supplied with a source of control voltage to turn off the channel of the second FET regardless of the amount of charge stored on or the potential of the floating gate.

Further in accordance with the invention, there is provided a method for operating such a memory cell. To transfer data from the volatile element to the non-volatile element, a programming/erase (P/E) gate is driven first positive and then negative. In the positive state, a positive charge is stored on the floating gate if the data at the data node is a data 0. Otherwise, during the negative state, a negative charge is stored on the floating gate if the data at the data node is a data 1. In either case, the potential of the floating gate is changed by current flowing through the DEIS material layer. To recover data stored on the floating gate, the second control gate of the dual gate FET is first taken to a positive level. The floating gate, if it is then charged with a positive charge, will, in cooperation with the positive level on the second control gate, turn on the channel of the dual gate FET, and hence force the data node to ground to change the volatile element to the data 0 state. If the floating gate is charged negatively, the channel region under the floating gate of the second FET will be off so that the volatile element is left in the data 1 state. The second control gate voltage is then returned to ground to allow normal operations to commence.

DESCRIPTION OF THE PREFERRED EMBODIMENTS

Figure 1:
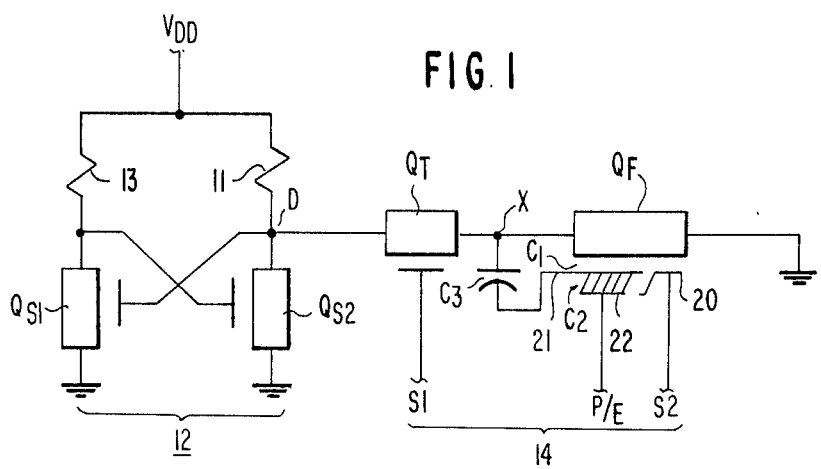
FIG. 1 is a schematic representation of a single cell of a memory array of the invention.

Referring now to FIG. 1, there is shown therein a schematic diagram of a single cell of a non-volatile memory array constructed in accordance with the teachings of the present invention. Of course, in a practical embodiment of a memory array, a large number of such cells would be provided arranged in rows and columns.

The memory cell is composed of a volatile storage unit or element 12 and a non-volatile storage element 14. The volatile storage unit or element 12 is composed of two FETS $Q_{S1}$ and $Q_{S2}$ connected in a flip-flop arrangement with the gate of the FET $Q_{S2}$ connected to the drain of the FET $Q_{S1}$ and to a voltage source $V_{DD}$ through a resistor 13 and the gate of the FET $Q_{S1}$ connected to the drain of the FET $Q_{S2}$ and to the voltage source $V_{DD}$ through a resistor 11. The sources of the FETs $Q_{S1}$ and $Q_{S2}$ are grounded.

The flip-flop circuit is made asymmetrical so that it will always "come up" in the data 1 state (a data at node D) when power is initially applied thereto. This may be done, for instance, by making the resistance value of the resistor 11 less than that of the resistor 13.

The non-volatile storage element 14 is composed of an ordinary FET $Q_T$ and a dual gate FET $Q_F$. The channels of the FETs $Q_T$ and $Q_F$ are connected in series between a data node D (at the drain of the FET $Q_{S2}$) and ground. The gate of the FET $Q_T$ is connected to a source of a first pulsed control voltage $S_1$.

The dual gate FET $Q_F$ has two gates 20 and 21. The gate 21 is a floating gate while the gate 20 is an ordinary FET control gate. Both of the gates 20 and 21 are separated from the channel of the FET $Q_F$ by the same thin layer of gate oxide. This arrangement will be explained in further detail below in the discussion of the actual physical construction of the non-volatile storage unit 14. The gate 20 is connected to a second pulsed voltage source $S_2$.

A first capacitor $C_1$ is formed between the floating gate 21 and the channel of the FET $Q_F$ while a second capacitor $C_2$ is formed between an upper electrode 22 and the floating gate 21. The upper electrode 22, which functions as a second control gate of the FET $Q_F$, is connected to a programming/erase voltage source on a line P/E. A third capacitor $C_3$ is connected between the floating gate 21 and a data node X at the connection point between the FETs $Q_T$ and $Q_F$. The dielectric for the capacitor $C_3$ is also formed from the same thin layer of gate oxide used to separate the gates 20 and 21 from the channel of the FET $Q_F$.

Figure 2:
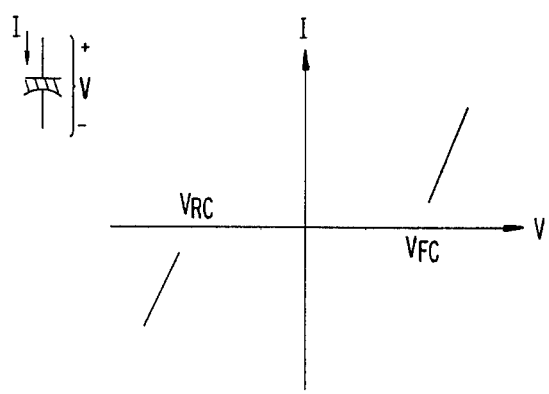
FIG. 2 is a graph showing an I–V characteristic of the DEIS material used as a dielectric through which the floating gate of a floating gate FET in the circuit of FIG. 1 is charged and discharged.

The dielectric of the capacitor $C_2$ is at least partially formed with DEIS material of the type disclosed in the above-discussed article and patent application of Di- Maria et al. The I–V characteristics of such DEIS material are shown in the graph of FIG. 2. With reference to this graph, when the voltage across the DEIS material exceeds a voltage $V_{FC}$ in the forward direction or $V_{RC}$ in the reverse direction, the material begins to conduct, thereby allowing charge transfer to or from the floating gate 21. On the other hand, if the voltage across the DEIS material is less than these voltages, the DEIS material acts as a good insulator and prevents any enhancement or depletion of the charge on the floating gate 21.

The operation of the memory cell shown in schematic form in FIG. 1 will now be explained.

In normal operations, that is, when no non-volatile storing operation is to be performed, $S_1$ is at a low logic level to turn off the channel of the FET $Q_T$. This isolates the non-volatile memory unit 14 from the volatile memory unit 12 to thus permit the volatile memory unit 12 to function normally as in an ordinary RAM.

While the volatile memory unit 12 is functioning normally, the nonvolatile memory unit 14 may be erased. To perform an erasing operation, the program/erase line P/E is taken to a high positive voltage, for instance, 20 volts, while $S_2$ is taken to a high logic level. This action turns on the channel of the FET $Q_F$ to thereby ground the node X. If the voltage applied to the electrode 22 is sufficiently high to cause the DEIS material of the capacitor $C_2$ to conduct, a charge will be stored on the floating gate 21 of a magnitude determined by the relative values of the capacitors $C_1$, $C_2$ and $C_3$ and the applied voltage.

Figure 3:
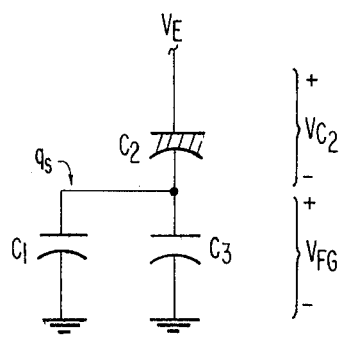
FIG. 3 shows an equivalent circuit of the non-volatile memory element portion of the memory cell of FIG. 1 at the end of an erase operation.

An equivalent circuit for the erasing operation of the non-volatile memory element 14 of the memory cell circuit of FIG. 1 is shown in FIG. 3. Here, $V_E$ represents the high positive voltage applied to the program/erase line P/E. In this situation, the voltage $V_{C2}$ across the capacitor $C_2$ and the voltage $V_{FG}$ of the floating gate electrode 21 relative to ground are:

$$V_{C2} = \frac{(C_1 + C_3)V_E - q_S}{C_1 + C_2 + C_3}, \text{ and } V_{FG} = \frac{C_2 V_E + q_S}{C_1 + C_2 + C_3},$$

where $q_S$ is the charge on the floating gate electrode 21. At the end of the erasing operation, $V_{C2} = V_{FC}$ (the drop across the DEIS material in the forward direction when the DEIS material is conductive). Hence, at the end of the erasing operation, $$q_S = (C_1 + C_3)V_E - (C_1 + C_2 + C_3)V_{FC}.$$

Thus, it can easily be appreciated that the charge on the floating gate electrode 21 can be set to any desired value by proper choice of the ratios of the capacitors $C_1$, $C_2$ and $C_3$ and the programming voltage $V_E$. Preferably, the charge $q_S$ is positive to thereby make the term $BV_{GO}$ positive and hence to increase the breakdown voltage $BV_{N-P}$.

To perform a storing operation in the non-volatile memory unit 14, $S_1$ is set to a high logic level to thereby turn on the FET $Q_T$ while $S_2$ is taken to a low logic level to thereby turn off the channel of the FET $Q_F$. The program/erase line P/E is then taken to a negative voltage, for instance, in a range of $-5$ to $-8$ volts. The voltage at the data node D then controls the amount of charge which will be impressed upon the floating gate 21.

Figure 4:
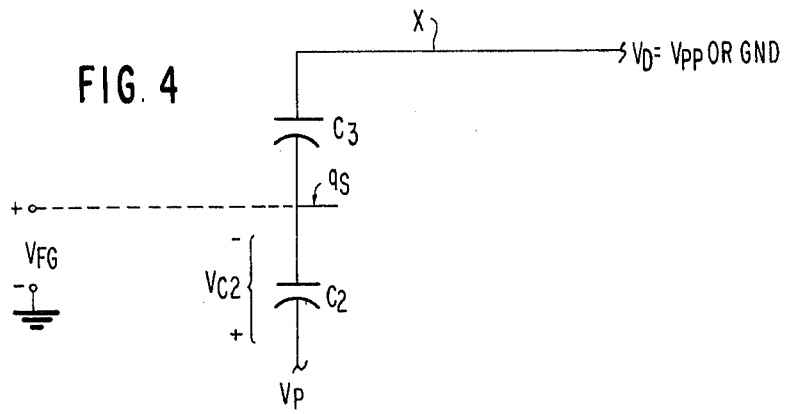
FIG. 4 shows an equivalent circuit of the non-volatile memory element portion of the memory cell of FIG. 1 at the end of a programming operation.

This operation will be explained in more detail with reference to FIG. 4, which shows an equivalent circuit diagram for the non-volatile memory unit 14 during the programming operation. Here, $V_{PP}$ is the voltage at the data node D for a data 1. For a data 0, the data node D will be at ground.

During the storing operation, the voltages $V_{C2}$ and $V_{FG}$ are:

$$V_{FG} = \frac{C_3 V_D + C_2 V_P + q_S}{C_2 + C_3}, \text{ and } V_{C2} = \frac{C_3(V_P - V_D) - q_S}{C_2 + C_3}.$$

Hence, the charge which is stored on the floating gate electrode 21 will be:

$$q_S = C_3(V_P - V_D) - (C_2 + C_3)V_{RC},$$

where it will be recalled that $V_{RC}$ is the voltage across the DEIS material for conduction in the reverse direction. For a data 1:

$$q_S = q_{S-1} = C_3(V_P - V_{PP}) - (C_2 + C_3)V_{RC},$$

while for a data 0:

$$q_S = q_{S-0} = C_3 V_P - (C_2 + C_3)V_{RC}.$$

It may be noted that the difference in the charge $q_S$ between data 0 and data 1 is:

$$\Delta q_S = q_{S-0} - q_{S-1} = C_3 V_{PP}.$$

The difference in the charge is used to control the conduction in the FET $Q_F$ during a subsequent data recovery operation.

To perform a data recovery operation, such as when power is first being applied to the memory array following a power outage, the program/erase line P/E is set to a voltage level such that a charge of $q_{S-0}$ causes the FET $Q_F$ to be on while a charge of $q_{S-1}$ causes the FET $Q_F$ to be off. During the data recovering operation, $S_1$ and $S_2$ are set to high logic levels. If a charge of $q_{S-0}$ is stored on the floating gate 21, the channel of the FET $Q_F$ will be turned on (as is the channel of the FET $Q_T$ in all cases during the data recovering operation) thereby grounding the node D and forcing the flip-flop circuit of the volatile memory element 12 to the data 0 state. On the other hand, if a charge $q_{S-1}$ is stored on the floating gate 21, the channel of the FET $Q_F$ will be off, and hence the operation of the flip-flop circuit of the volatile memory unit 12 will be unaffected during the power-up operation, leaving it in the data 1 state. That is, because the flip-flop circuit is assymetrical, the flip-flop circuit will be powered-up with the data node D at the data 1 state, where it remains following the restoring operation.

Referring now to the top view of FIG. 5A and the cross-sectional view of FIG. 5B, the structure of the dual gate FET $Q_F$ of FIG. 1 will now be described. The device is fabricated upon a substrate 30. To the right-hand side of the area of the FET $Q_F$, a drain or ground diffusion 33 is formed, while to the left-hand side of the area, an N+ diffusion 31 is formed corresponding to the node X. To form the capacitor $C_3$, an implanted or heavily doped area 34 is formed extending rightward from the N+ diffusion 33. Above the diffusion 34 floating gate 21 is located, preferably formed as a layer of polysilicon material separated from the surface of the substrate 30 by a thin oxide layer, the same thin oxide layer which separates the gate 20 from the surface of the substrate 30 in the channel region. (For purposes of clarity, the oxide layer has been omitted from FIGS. 5A and 5B.) The capacitor $C_1$ is formed by a portion of the floating gate 21 extending past the diffusion 34. By forming the capacitors $C_1$ and $C_3$ from this thin oxide layer, their capacitance values are made quite high without requiring a large area.

A segment 32 of DEIS material is positioned above a portion of the floating gate 21, between the electrode 22 and the upper surface of the floating gate 21. The gate 20 is also formed from polysilicon material. As mentioned above, a portion of the gate 20 is separated from the surface of the substrate 30 by the thin oxide layer. A second portion of the gate 20 overlaps the edge of the floating gate 21 above the channel of the device. Of course, the spaces between the floating gate 21, the gate 20 and the electrode 22 would be filled with an insulating oxide, again, the oxide being omitted for purposes of clarity.

Figure 5A:
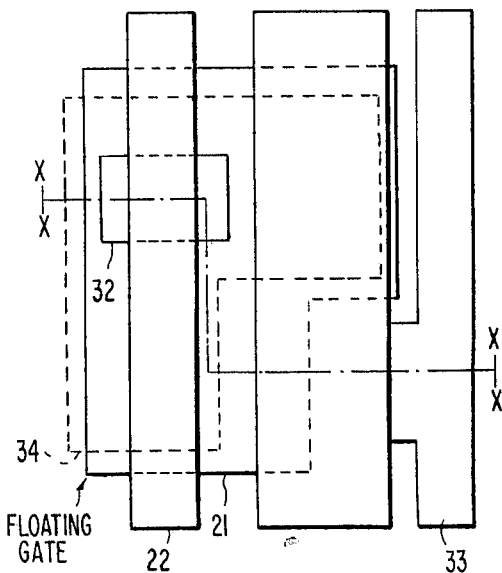
FIG. 5A is a top view and FIG. 5B is a side view of the non-volatile memory element portion of the memory cell of FIG. 1 formed as an integrated circuit.
Figure 5B:
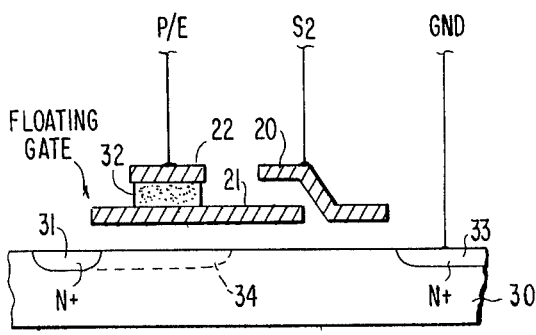

The FET $Q_T$ and the flip-flop circuit are fabricated to the left of the FET $Q_F$ in the view shown in FIGS. 5A and 5B. The fabrication of these devices is accomplished with well-known integrated circuit techniques.

This completes the description of the preferred embodiments of the invention. Although preferred embodiments have been described, it is believed that numerous alterations and modifications thereto would be apparent to one having ordinary skill in the art without departing from the spirit and scope of the invention.

I claim:

1. A semiconductor memory array having a plurality of memory cells, each of said cells comprising:
    a static volatile memory element including at least one data node; and
    a non-volatile memory element coupled to said static memory element for storing data from said static memory unit and transferring data to said static memory unit in a non-volatile manner, said non-volatile memory unit comprising switch means for coupling said data node to a second node in response to a first control signal, and a dual gate FET having a channel connected to said second node, said dual gate FET having first and second gates for controlling a channel conductivity of said dual gate FET with said first gate being connected to receive a second control signal and said second gate being a floating gate, a control electrode connected to receive a third control signal, and a segment of DEIS material disposed between said control electrode and said second gate, said first and second gates being separated from said channel of said dual gate FET by a gate oxide layer.

2. The memory array of claim 1 further comprising a capacitor coupled between said second gate and said second node.

3. The memory array of claim 2 wherein said volatile memory element comprises a flip-flop circuit.

4. The memory array of claim 3 wherein said flip-flop circuit is asymmetrical to cause said flip-flop circuit to be in a predetermined state following application of power thereto.

5. The memory array of claim 4 wherein said flip-flop circuit comprises second and third FETs, and wherein said switching means comprises a fourth FET having a channel connected between said data node and said second node and a gate connected to receive said first control signal.

6. The memory array of claim 5 wherein said segment of DEIS material is disposed vertically above said second gate.

7. A semiconductor memory array having a plurality of memory cells, each of said cells comprising:
    a static volatile memory element comprising first and second FETs, sources of said first and second FETs being connected to ground, a gate of said first FET being connected to a drain of said second FET, a gate of said second FET being connected to a drain of said first FET, said drains of said first and second FETs being connected to a positive voltage source through first and second resistors, respectively, a data node being formed at said drain of said second FET, parameters of said first and second FETs and first and second resistors being determined such that, when said positive voltage source is activated, a voltage representing a data 1 is present at said data node; and
    a non-volatile memory element connected to said data node, said non-volatile memory element comprising a third FET having a drain connected to said data node, a source connected to a second node, and a gate connected to receive a first control signal, and a dual gate fourth FET having a drain connected to said second node and a source connected to ground, first and second gates separated from a channel of said dual gate FET by a thin layer of gate oxide with said first gate being connected to receive a second control signal and said second gate being a floating gate, a capacitor coupled between said floating gate and said second node, a control electrode disposed parallel to said floating gate on the side thereof away from said channel of said dual gate FET, said control electrode being coupled to receive a third control signal, and a segment of DEIS material disposed between said control electrode and said floating gate.

8. A method for erasing said non-volatile memory element of claim 7 comprising the steps of:
    taking said first control signal to ground;
    taking said second control signal to a positive voltage and taking said third control signal to a high positive voltage.

9. The method of claim 8 wherein said high positive voltage is approximately 20 volts.

10. A method of storing data in said non-volatile memory element of claim 7 comprising the steps of:
    taking said first control signal to a high logic level;
    taking said second control signal to a low logic level; and
    taking said third control signal to a negative voltage.

11. The method of claim 10 wherein said negative voltage is in a range of −5 to −8 volts.

12. A method for transferring data from said non-volatile memory element to said volatile memory element of said memory cell of claim 7 comprising the steps of:
    activating said positive voltage source to set a flip-flop circuit composed of said first and second FETs and said first and second resistors in said predetermined state with said voltage representing a data 1 at said data node; and
    taking said first and second control signals to a high logic level and said third control signal to a positive voltage sufficiently high to cause the channel of said dual gate FET to be on for a charge stored on said floating gate representing a data 0 and to be off for a charge stored on said floating gate representing a data 1.

* * * * *